(12) United States Patent
Zhang (10) Patent No.: US 11,469,397 B2
(45) Date of Patent: Oct. 11, 2022

(54) ARRAY SUBSTRATE HAVING FILM LAYER DISCONNECTED AT CORRESPONDING GROOVE AND OLED DISPLAY PANEL HAVING THE SAME, AND MASK

(71) Applicant: Wuhan China Star Optoelectronics Semiconductor Display Technology Co., Ltd., Wuhan (CN)

(72) Inventor: Xingyong Zhang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 145 days.

(21) Appl. No.: 16/768,693

(22) PCT Filed: Feb. 12, 2020

(86) PCT No.: PCT/CN2020/074855
§ 371 (c)(1),
(2) Date: Jun. 1, 2020

(87) PCT Pub. No.: WO2021/056948
PCT Pub. Date: Apr. 1, 2021

(65) Prior Publication Data
US 2021/0408470 A1    Dec. 30, 2021

(30) Foreign Application Priority Data

Sep. 29, 2019  (CN) .......................... 201910934726.5

(51) Int. Cl.
*H01L 51/52*  (2006.01)
*H01L 27/32*  (2006.01)
*H01L 51/56*  (2006.01)
*C23C 16/04*  (2006.01)

(52) U.S. Cl.
CPC ...... *H01L 51/5253* (2013.01); *H01L 27/3244* (2013.01); *H01L 51/56* (2013.01); *C23C 16/042* (2013.01)

(58) Field of Classification Search
None
See application file for complete search history.

(56) References Cited

U.S. PATENT DOCUMENTS

| 2016/0270209 | A1* | 9/2016 | Cho | G06F 1/1652 |
| 2018/0166525 | A1* | 6/2018 | Kim | G01N 27/20 |
| 2019/0157607 | A1* | 5/2019 | Kim | H01L 51/0097 |
| 2020/0127220 | A1* | 4/2020 | Kim | H01L 51/5012 |
| 2020/0127228 | A1* | 4/2020 | Huang | H01L 51/5253 |

* cited by examiner

*Primary Examiner* — Michael Jung (57) ABSTRACT

The present invention provides an array substrate, an OLED display panel, and a mask. The array substrate includes a predetermined film-forming region and a non-film forming region. The non-film forming region is provided with a shadow region close to the predetermined film-forming region. An actual film forming region of a film layer to be formed on the array substrate includes the predetermined film-forming region and the shadow region. The array substrate is provided with a groove or a protrusion in the corresponding shadow region, so that the film layer is disconnected at the corresponding groove or the protrusion to form a discontinuous film.

5 Claims, 5 Drawing Sheets

ARRAY SUBSTRATE HAVING FILM LAYER DISCONNECTED AT CORRESPONDING GROOVE AND OLED DISPLAY PANEL HAVING THE SAME, AND MASK

RELATED APPLICATIONS

This application is a National Phase of PCT Patent Application No. PCT/CN2020/074855 having International filing date of Feb. 12, 2020, which claims the benefit of priority of Chinese Patent Application No. 201910934726.5 filed on Sep. 29, 2019. The contents of the above applications are all incorporated by reference as if fully set forth herein in their entirety.

FIELD AND BACKGROUND OF THE INVENTION

The present application relates to the field of display technologies, and in particular, to an array substrate, an OLED display panel, and a mask.

Compared with traditional liquid crystal displays, AMO-LEDs have advantages of high contrast, wide viewing angles, wide color gamut, and high resolution. With expansion of OLED application fields, new application fields will have increasingly higher requirements for OLED devices, especially requirements for encapsulated inorganic films.

Current encapsulated inorganic films formed by chemical vapor deposition (CVD) methods must be assisted by masks to pattern film layers. However, there is an unavoidable problem with use of a mask, which is called shadow effect. The so-called shadow is due to existence of a certain gap between the mask and a substrate during film formations, and plasma will enter a non-open region at an edge of the mask to form a film. The thin film in the region is thinner than a normal film-forming region and has a longer extension distance. It poses certain risks for subsequent device cutting and reliability verification. However, the shadow effect in CVD film formation process is unavoidable in the current industry.

Therefore, current technologies have defects and urgently need improvement.

SUMMARY OF THE INVENTION

The present invention provides an array substrate, an OLED display panel, and a mask, which can solve adverse effects caused by film layers disposed in shadow regions on film layers of a predetermined film-forming region, and resolve shadow effects generated in CVD processes.

In order to solve the above problems, the technical solution provided by the present invention is as follows:

An array substrate provided by the present invention comprises a predetermined film-forming region and a non-film forming region surrounding the predetermined film-forming region, wherein the non-film forming region comprises a shadow region, and the shadow region surrounds and is close to the predetermined film-forming region;

wherein an actual film forming region of a film layer to be formed on the array substrate comprises the predetermined film-forming region and the shadow region; and wherein the array substrate is provided with a groove or a protrusion in the corresponding shadow region, so that the film layer is disconnected at the corresponding groove or the protrusion.

In the array substrate of the present invention, the array substrate is provided with retaining walls in the predetermined film-forming region, at least one of the retaining walls is arranged in a ring shape at a position close to the non-film forming region, and at least one of the groove or the protrusion is disposed around the predetermined film-forming region.

In the array substrate of the present invention, a distance between the retaining wall and the groove or the protrusion is a distance from a boundary of the film layer corresponding to the predetermined film-forming region to the retaining wall.

In the array substrate of the present invention, a cross-sectional width at an opening of the groove is less than a cross-sectional width at a bottom of the groove, and a side wall of the groove is an arc surface or an inclined surface arranged at a preset angle.

In the array substrate of the present invention, there is a difference in level between the film layer disposed in the groove and other portions of the film layer, and the film layer is disconnected at an edge of the groove.

In the array substrate of the present invention, a cross-sectional width of a top of the protrusion is greater than a cross-sectional width of a bottom of the protrusion, and a side wall of the protrusion is a curved surface or an inclined surface arranged at a preset angle.

In the array substrate of the present invention, there is a difference in level between the film layer disposed on the protrusion and other portions of the film layer, and the film layer is disconnected at an edge of the protrusion.

In the array substrate of the present invention, the array substrate is provided with spaced signal traces at a position corresponding to the shadow region, the groove is arranged to avoid the signal traces, or the protrusion is disposed corresponding to the signal traces.

In order to solve the above technical problems, the present invention further provides an OLED display panel, which comprises the above-mentioned array substrate, and an organic light emitting layer and a thin film encapsulation layer;

wherein the array substrate is provided with a pixel opening region disposed corresponding to the predetermined film-forming region, and the organic light emitting layer is disposed corresponding to the pixel opening region;

wherein the thin film encapsulation layer is disposed on a surface of the organic light emitting layer, the thin film encapsulation layer comprises an inorganic film layer and an organic film layer which are arranged in a stack, and the organic film layer is wrapped between two adjacent inorganic film layers;

wherein the organic film layer is correspondingly disposed in the predetermined film-forming region, and the inorganic film layer extends from the predetermined film-forming region to a side of the shadow region; and wherein the groove or the protrusion disposed on the array substrate corresponding to the shadow region cause the inorganic film layer to form a difference in level, the inorganic film layer is disconnected at an edge corresponding to the groove or the protrusion to form the thin film encapsulation layer corresponding to the predetermined film-forming region.

In order to solve the above technical problems, the present invention further provides a mask applied to a manufacturing of an OLED display panel. The mask comprises a shielding portion and an opening portion, wherein the OLED display panel comprises a predetermined film-forming region and a non-film forming region surrounding the predetermined film-forming region;

wherein the opening portion of the mask corresponds to the predetermined film-forming region, the shielding portion corresponds to the non-film forming region, and forms a film layer with a preset pattern on the OLED display panel corresponding to the predetermined film-forming region; and wherein an edge portion of the shielding portion adjacent to the opening portion faces a side surface of the OLED display panel is an inclined surface or an arc, so that a distance between a portion of the shielding portion adjacent to the opening portion and the OLED display panel is less than a distance between a remaining portion of the shielding portion and the OLED display panel In the mask of the present invention, the mask is used to form a thin film encapsulation layer in the predetermined film-forming region, an edge portion of the shielding portion near the opening portion is inclined to a side close to the OLED display panel, and a thickness of the edge portion of the shielding portion is greater than a thickness of other portions.

The beneficial effect of the present invention is: compared with current display panels, an array substrate, an OLED display panel, and a mask provided in the present invention are formed by providing grooves or protrusions in corresponding shadow regions of the array substrate. A film layer on the substrate is disconnected at corresponding grooves or protrusions to form a discontinuous film, thereby preventing the film layer disposed in the shadow regions from causing adverse effect on the film layer of a predetermined film-forming region. In addition, the present invention further processes an edge of openings of the mask to achieve a purpose of reducing areas of the shadow regions, thereby facilitating a design of narrow borders of display panels and reducing effect of shadow effect.

BRIEF DESCRIPTION OF THE SEVERAL VIEWS OF THE DRAWINGS

In order to more clearly illustrate the embodiments or the technical solutions in the prior art, a brief introduction of the drawings used in the embodiments or the prior art description will be briefly described below. Obviously, the drawings in the following description are only some of the embodiments of the invention, and those skilled in the art can obtain other drawings according to the drawings without any creative work.

DESCRIPTION OF SPECIFIC EMBODIMENTS OF THE INVENTION

The following description of the various embodiments is provided with reference to the accompanying drawings. Directional terms, such as upper, lower, front, back, left, right, inner, outer, and lateral side, mentioned in the present invention are only for reference. Therefore, the directional terms are used for describing and understanding rather than limiting the present invention. In the figures, units having similar structures are used for the same reference numbers.

The present invention is directed to a current display panel. Current films formed by chemical vapor deposition (CVD) methods must be assisted by masks to pattern film layers. However, there is an unavoidable problem with the use of a mask, which is called shadow effect. The so-called shadow is due to existence of a certain gap between the mask and a substrate during film formations, and plasma will enter a non-open region at an edge of the mask to form a film. The thin film in the region is thinner than a normal film-forming region and has a longer extension distance. It poses certain risks to the subsequent device cutting and reliability verification, and is not conducive to a design of narrow borders.

Figure 1:
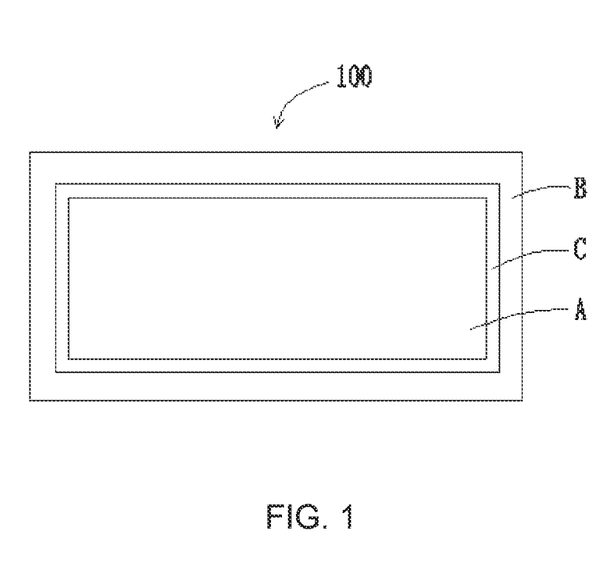
FIG. 1 is a top view of an array substrate according to an embodiment of the present invention.

Therefore, the present invention provides an array substrate, which can solve the above defects. Shown in FIG. 1 is a top view of the array substrate provided according to an embodiment of the present invention. The array substrate 100 comprises a predetermined film-forming region A and a non-film forming region B surrounding the predetermined film-forming region A. The non-film forming region B comprises a shadow region C, and the shadow region C surrounds and is close to the predetermined film-forming region A. An actual film-forming region of a film layer to be formed on the array substrate 100 comprises the predetermined film-forming region A and the shadow region C. Wherein, the array substrate 100 is provided with a groove or a protrusion surrounding the predetermined film-forming region A in the corresponding shadow region C, so that there is a difference in level formed between a portion of the film layer corresponding to the predetermined film-forming region A and a portion corresponding to the shadow region C. That is, the film layer is disconnected at the corresponding groove or the protrusion, thereby forming a discontinuous film. By applying for the design, reliability of subsequent device cutting and reliability verification can be guaranteed, and associated adverse effects on the film layer of the predetermined film-forming region A can be prevented.

In the embodiment, the film layer is a thin film encapsulation layer as an example, but it is not limited thereto. The following uses the display panel formed by the array substrate provided by different embodiments of the present invention as an example for description.

Figure 2:
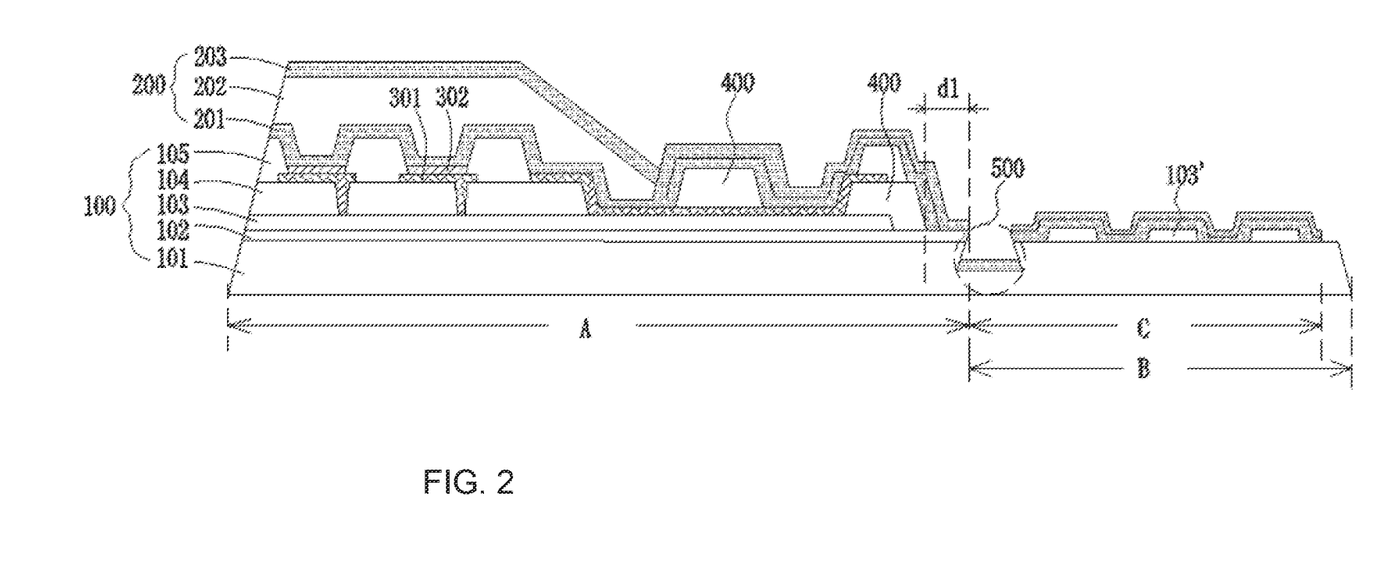
FIG. 2 is a schematic partial structural view of a display panel according to Embodiment 1 of the present invention.

Shown in FIG. 2 is a schematic partial structural view of the display panel according to Embodiment 1 of the present invention. The display panel comprises the array substrate 100, an organic light emitting device, and a thin film encapsulation layer 200. The array substrate 100 comprises, but is not limited to, a base substrate 101, an interlayer insulating layer 102, a source-drain metal layer 103, a passivation layer 104, and a pixel definition layer 105, which are sequentially stacked. The base substrate 101 comprises, but is not limited to, a substrate, and a buffer layer, an active layer, a gate insulating layer, and a gate electrode sequentially formed on the substrate. The source-drain metal layer 103 comprises source/drain electrodes and spaced signal traces 103'. The organic light emitting device is disposed corresponding to the pixel opening region defined by the pixel definition layer 105, and comprises an anode 301, an organic light emitting layer 302, and a cathode (not shown), which are arranged in a stack.

Wherein, the active layer, the gate electrode, and the source/drain electrodes form a thin film transistor. The thin film transistor and the organic light emitting device are correspondingly disposed in the predetermined film-forming region A, and the signal traces 103' are correspondingly disposed in the non-film forming region B.

The thin film encapsulation layer 200 is disposed on a surface of the organic light emitting device. The thin film encapsulation layer 200 comprises an inorganic film layer and an organic film layer which are arranged in a stack, and the organic film layer is wrapped between two adjacent inorganic film layers. In the drawings, the thin film encapsulation layer 200 comprises a first inorganic film layer 201, a second inorganic film layer 203, and an organic film layer 202 between the first inorganic film layer 201 and the second inorganic film layer 203. The organic film layer 202 is correspondingly disposed in the predetermined film-forming region A. The first inorganic film layer 201 and the second inorganic film layer 203 extend from the predetermined film-forming region A to a side of the shadow region C.

The array substrate 100 is provided with retaining walls 400 in the predetermined film-forming region A, and at least one of the retaining walls 400 is arranged in a ring shape at a position close to the non-film forming region B. The retaining wall 400 comprises, but is not limited to, one or more of the passivation layer 104 and the pixel definition layer 105, and is formed by patterning. The organic film layer 202 is blocked by the retaining walls 400 in the predetermined film-forming region A. Since the mask used for vapor deposition of the inorganic film layer has a shadow effect, the first inorganic film layer 201 and the second inorganic film layer 203 will extend from the predetermined film-forming region A to the shadow region. In the embodiment, grooves 500 are defined in the array substrate 100 in the corresponding shadow region C. At least one of the grooves 500 is defined around the predetermined film-forming region A, so that the thin film encapsulation layer 200 is disconnected at a position corresponding to the groove 500 to form a discontinuous film. That is, a portion of the thin film encapsulation layer 200 corresponding to the predetermined film-forming region A and a portion corresponding to the shadow region C are independent of each other.

A distance d1 between the retaining wall 400 and the groove 500 is a distance from a boundary of the thin film encapsulation layer 200 corresponding to the predetermined film-forming region A to the retaining wall 400. There is a difference in level between a stacked layer of the first inorganic film layer 201 and the second inorganic film layer 203 correspondingly disposed in the groove 500 and a stacked layer of the first inorganic film layer 201 and the second inorganic film layer 203 correspondingly disposed in other portions, so that the thin film encapsulation layer 200 is disconnected at an edge of the groove 500. A depth of the groove 500 is greater than a thickness of the stacked layer formed by the first inorganic film layer 201 and the second inorganic film layer 203, thereby ensuring formation of a discontinuous film. In the embodiment, the depth of the groove 500 is between 300 nm to 500 nm.

In an embodiment, a cross-sectional width at an opening of the groove 500 is less than a cross-sectional width of a bottom of the groove 500. A side wall of the groove 500 is an arc surface or an inclined surface arranged at a preset angle. An inclined angle of the inclined surface can be designed according to an actual process. The design can ensure that the inorganic film layer disposed in the groove 500 can be completely disconnected from the inorganic film layer in other portions. A cross-sectional shape of the groove 500 may be a regular trapezoid, or other regular or irregular polygons, which are not limited herein.

Figure 3:
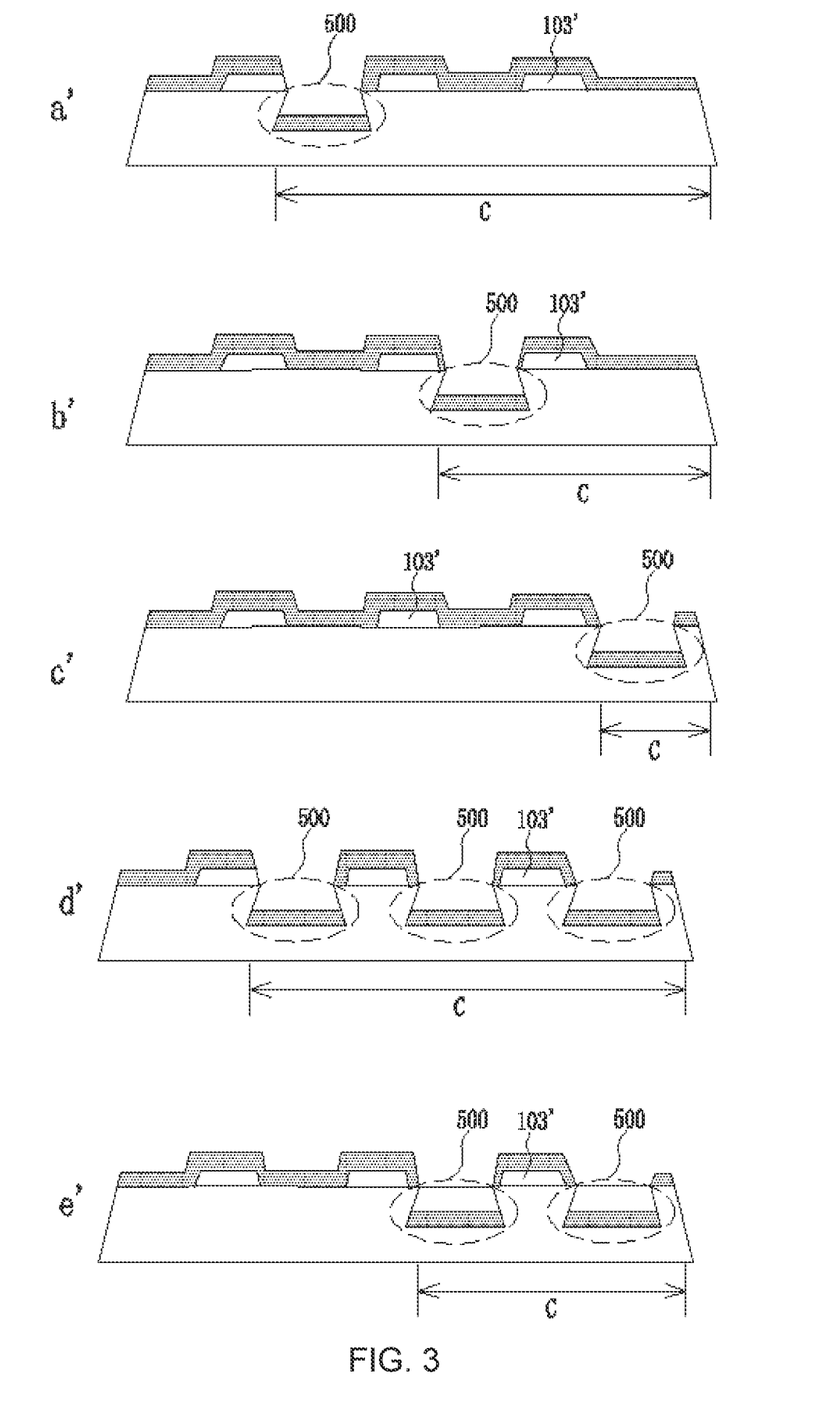
FIG. 3 is a schematic view of a position of a groove of the display panel according to Embodiment 1 of the present invention.

Shown in a' to e' in FIG. 3 is a schematic view of a position of the groove of the display panel according to Embodiment 1 of the present invention. In addition to the positions shown in FIG. 2, the positions and number of the groove 500 may be different according to a film-forming boundary of the CVD and the distance d1 of the retaining wall 400. As shown in a' to c' in the figure, according to a range of the shadow region C, the groove 500 is defined at a gap position between two adjacent signal traces 103'. Or, a position of the shadow region C avoids a setting region of the signal trace 103', and the groove 500 is defined next to the predetermined film-forming region. As shown in d' to e' in the figure, the grooves 500 may be defined as multiple grooves and spaced apart in the shadow region C.

Figure 4:
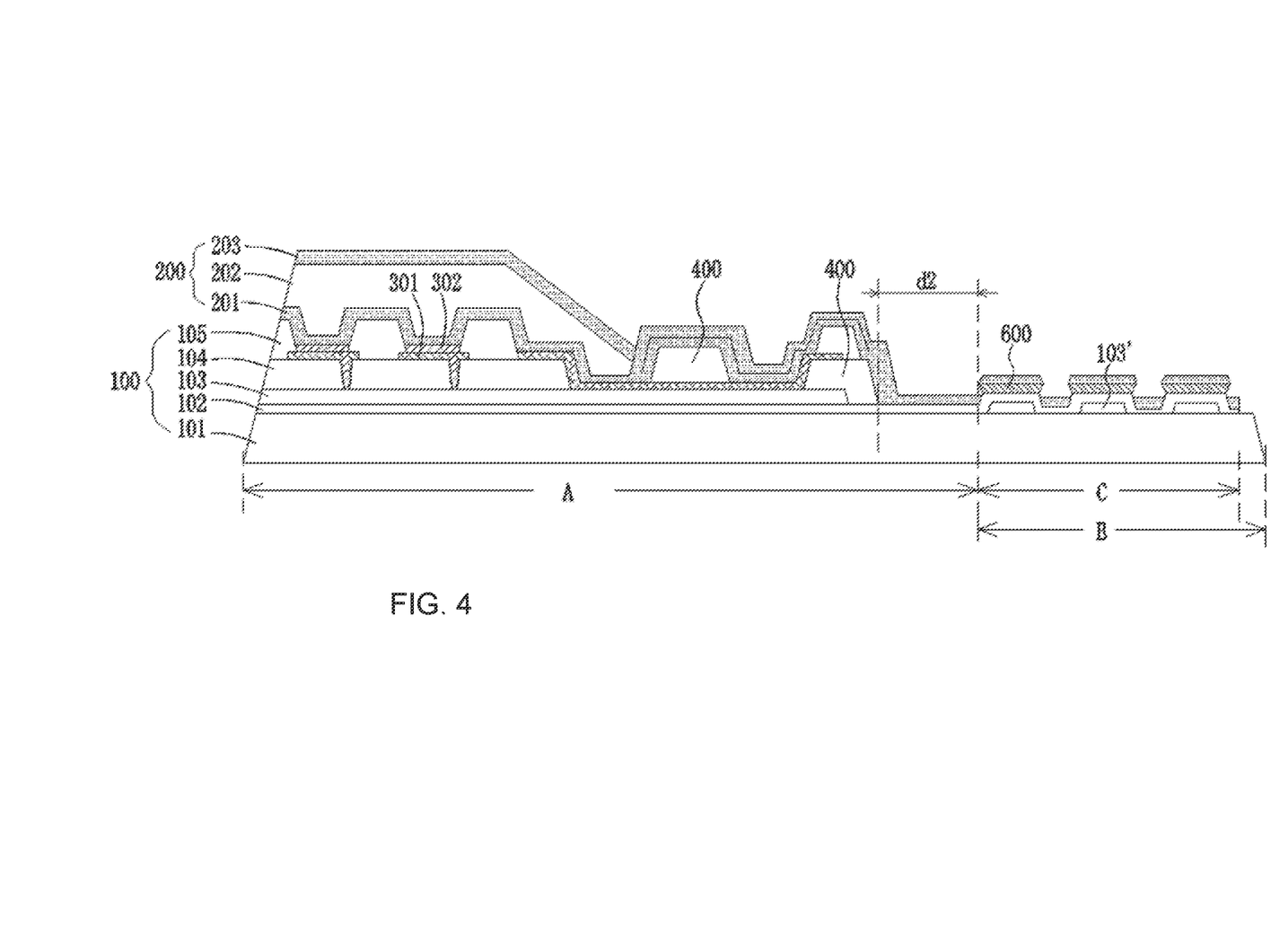
FIG. 4 is a schematic partial structural view of a display panel according to Embodiment 2 of the present invention.

Shown in FIG. 4 is a schematic partial structural view of the display panel according to Embodiment 2 of the present invention. Compared with Embodiment 1, the difference in the embodiment is that: the grooves are not provided in the embodiment, and protrusions 600 are provided in the array substrate 100 corresponding to the shadow region C. At least one of the protrusions 600 is disposed around the predetermined film-forming region A, so that the thin film encapsulation layer 200 is disconnected at a position corresponding to the protrusion 600 to form a discontinuous film. That is, a portion of the thin film encapsulation layer 200 corresponding to the predetermined film-forming region A and a portion corresponding to the shadow region C are independent of each other.

A distance d2 between the retaining wall 400 and the protrusion 600 is a distance from the boundary of the thin film encapsulation layer 200 corresponding to the predetermined film-forming region A to the retaining wall 400. In the shadow region C, there is a difference in level between a stacked layer of the first inorganic film layer 201 and the second inorganic film layer 203 correspondingly disposed in the protrusion 600 and a stacked layer of the first inorganic film layer 201 and the second inorganic film layer 203 correspondingly disposed in other portions, so that the thin film encapsulation layer 200 is disconnected at an edge of the protrusion 600. A depth of the protrusion 600 is greater than a thickness of the stacked layer formed by the first inorganic film layer 201 and the second inorganic film layer 203, thereby ensuring formation of a discontinuous film.

In an embodiment, a cross-sectional width of a top of the protrusion 600 is greater than a cross-sectional width of a bottom of the protrusion 600. A side wall of the protrusion 600 is a curved surface or an inclined surface arranged at a preset angle. An inclined angle of the inclined surface can be designed according to an actual process. The design can ensure that the inorganic film layer disposed on the protrusion 600 can be completely disconnected from the inorganic film layer in other portions. A cross-sectional shape of the protrusion 600 may be an inverted trapezoid, or other regular or irregular polygon, which is not limited herein.

In the embodiment, the protrusion 600 is disposed corresponding to the signal trace 103', so a terrain is formed by the signal trace 103', that is, a climbing slope is formed at a position corresponding to the signal trace 103'. It can further ensure that the inorganic film layer is disconnected at the protrusion 600. The protrusion 600 comprises, but is not limited to, one or more of the interlayer insulating layer 102, the source-drain metal layer 103, the passivation layer 104, and the pixel definition layer 105, and is formed after etching.

In other embodiments, the positions and number of the protrusion 600 may be different according to the film-forming boundary of the CVD and the distance d2 of the retaining wall 400. The design is similar to that of the grooves in the above embodiment and is not repeated here.

Wherein, the film structure of other portions of the display panel in the embodiment is the same as the film structure of the display panel in Embodiment 1, which is not repeated here.

The present invention further provides a mask, which is applied to a manufacturing of the OLED display panel. In the embodiment, the mask is applied to a manufacturing of the inorganic film layer of the thin film encapsulation layer, but it is not limited thereto.

Figure 5:
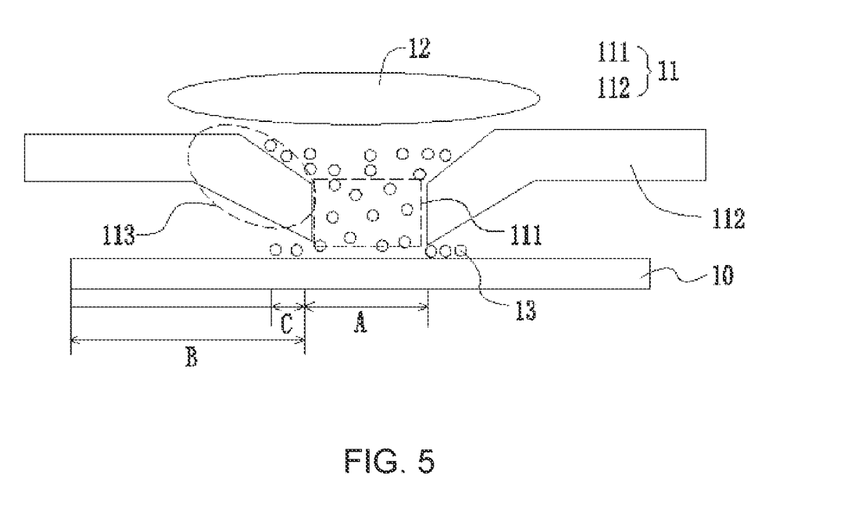
FIG. 5 is a schematic structural view of a mask according to an embodiment of the present invention.

As shown in FIG. 5, the mask 11 comprises a shielding portion 112 and an opening portion 111. The OLED display panel 10 comprises the predetermined film-forming region A and the non-film forming region B surrounding the predetermined film-forming region A. The opening portion 111 of the mask 11 corresponds to the predetermined film-forming region A, the shielding portion 112 corresponds to the non-film forming region B, and forms the thin film encapsulation layer with a preset pattern on the OLED display panel 10 corresponding to the predetermined film-forming region A. A target material 12 is disposed above the mask 11. The target material 12 is used for ejecting an inorganic material 13, and the inorganic material 13 is formed on a surface of the OLED display panel 10 through the opening portion 111.

An edge portion of the shielding portion 112 adjacent to the opening portion 111 facing a side surface of the OLED display panel 10 is an inclined surface or an arc surface, so that a distance between a portion of the shielding portion 112 adjacent to the opening portion 111 and the OLED display panel 10 is less than a distance between a remaining portion of the shielding portion 112 and the OLED display panel 10. For example, in an embodiment, a side surface of the shielding portion 112 away from the OLED display panel 10 is disposed on a same horizontal plane. As shown in Region 113, a side surface of the shielding portion 112 close to the OLED display panel 10 is an inclined surface or a curved surface.

In the embodiment, the mask 11 is used to form the thin film encapsulation layer in the predetermined film-forming region A, and an edge portion of the shielding portion 112 near the opening portion 111 is inclined to a side close to the OLED display panel 10, as shown in Region 113. A thickness of an edge portion of the shielding portion 112 is greater than a thickness of other portions.

Because the opening edge of the mask 11 is processed as described above, the edge of the shielding portion 112 of the mask 11 can be closer to the OLED display panel 10. Compared with a conventional mask, the present invention can further reduce the distance between the mask 11 and the OLED display panel 10. That is, a channel of the inorganic material 13 from the predetermined film-forming region A into the non-film forming region B can be further reduced, so as to achieve the purpose of reducing the shadow region C, thereby facilitating the design of narrow borders of the display panel and reducing effect of shadow effect.

In the above, the array substrate, the OLED display panel, and the mask provided in the present invention are formed by providing the grooves or the protrusions in the corresponding shadow region of the array substrate. The film layer on the substrate is disconnected at the corresponding grooves or protrusions to form the discontinuous film, thereby preventing the film layer disposed in the shadow region from causing adverse effect on the film layer of the predetermined film-forming region. In addition, the present invention further processes an edge of openings of the mask to achieve the purpose of reducing areas of the shadow region, thereby facilitating the design of narrow borders of the display panel and reducing the effect of the shadow effect.

In the above, various other corresponding changes and modifications can be made according to the technical solutions and technical ideas of the present invention to those skilled in the art, and all such changes and modifications are within the scope of the claims of the present invention.

What is claimed is:

1. An array substrate, comprising:
a predetermined film-forming region and a non-film forming region surrounding the predetermined film-forming region, wherein the non-film forming region comprises a shadow region, and the shadow region surrounds and is close to the predetermined film-forming region;
wherein the array substrate comprises a base substrate, spaced signal traces disposed on the base substrate and located in the shadow region, and a film layer formed on the base substrate, and the film layer is located in the predetermined film-forming region and the shadow region; and
wherein the base substrate is provided with a groove in the corresponding shadow region, the film layer is disconnected at the groove, the groove is arranged to avoid the signal traces, and there is a difference in level between the film layer disposed in the groove and other portions of the film layer, the film layer is disconnected at an edge of the groove.

2. The array substrate as claimed in claim 1, wherein the array substrate is provided with retaining walls in the predetermined film-forming region, at least one of the retaining walls is arranged in a ring shape at a position close to the non-film forming region, and at least one of the groove is defined around the predetermined film-forming region.

3. The array substrate as claimed in claim 2, wherein a distance between the retaining wall and the groove is a distance from a boundary of the film layer corresponding to the predetermined film-forming region to the retaining wall.

4. The array substrate as claimed in claim 1, wherein a cross-sectional width at an opening of the groove is less than a cross-sectional width at a bottom of the groove, and a side wall of the groove is an arc surface or an inclined surface arranged at a preset angle.

5. An OLED display panel, comprising:
the array substrate according to claim 1, and an organic light emitting layer and a thin film encapsulation layer;
wherein the array substrate is provided with a pixel opening region disposed corresponding to the predetermined film-forming region, and the organic light emitting layer is disposed corresponding to the pixel opening region;
wherein the thin film encapsulation layer is disposed on a surface of the organic light emitting layer, the thin film encapsulation layer comprises an inorganic film layer and an organic film layer which are arranged in a stack, and the organic film layer is wrapped between two adjacent inorganic film layers;
wherein the organic film layer is correspondingly disposed in the predetermined film-forming region, and the inorganic film layer extends from the predetermined film-forming region to a side of the shadow region; and
wherein the groove defined on the array substrate corresponding to the shadow region causes the inorganic film layer to form the difference in the level, and the inorganic film layer is disconnected at an edge corresponding to the groove to form the thin film encapsulation layer corresponding to the predetermined film-forming region.

\* \* \* \* \*